US012421618B2

(12) United States Patent
Liu et al.

(10) Patent No.: US 12,421,618 B2
(45) Date of Patent: Sep. 23, 2025

(54) ANTI-CRACKING SUCTION DEVICE COMPRISING OUTER CYLINDER, INNER CYLINDER, SUCTION TUBE, AND FIRST GAP BETWEEN INNER AND OUTER CYLINDERS

(71) Applicant: TCL ZHONGHUAN RENEWABLE ENERGY TECHNOLOGY CO., LTD, Tianjin (CN)

(72) Inventors: Zhenyu Liu, Tianjin (CN); Jian Xu, Tianjin (CN); Zilong Zhao, Tianjin (CN); Long Xiang, Tianjin (CN); Jianping Wang, Tianjin (CN); Jianping Gao, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 18/040,128

(22) PCT Filed: Nov. 25, 2022

(86) PCT No.: PCT/CN2022/134317
§ 371 (c)(1),
(2) Date: Jan. 31, 2023

(87) PCT Pub. No.: WO2023/165178
PCT Pub. Date: Sep. 7, 2023

(65) Prior Publication Data
US 2024/0247397 A1    Jul. 25, 2024

(30) Foreign Application Priority Data
Mar. 1, 2022   (CN) .......................... 202210196125.0

(51) Int. Cl.
C30B 35/00   (2006.01)
C30B 15/00   (2006.01)
C30B 29/06   (2006.01)
(52) U.S. Cl.
CPC .............. C30B 15/00 (2013.01); C30B 29/06 (2013.01)

(58) Field of Classification Search
CPC ......... C30B 15/00; C30B 15/02; C30B 15/04; C30B 15/20; C30B 29/00; C30B 29/02; C30B 29/06; C30B 35/00; C30B 35/002
(Continued)

(56) References Cited

U.S. PATENT DOCUMENTS 5,288,366 A * 2/1994 Holder .................... C30B 15/02
                                                          117/214
5,372,090 A * 12/1994 Wegmeth ............... C30B 15/10
                                                          117/900
(Continued)

FOREIGN PATENT DOCUMENTS

CN    215517729 U    1/2022
CN    215517736 U    1/2022
(Continued)

OTHER PUBLICATIONS

International Search Report in International application No. PCT/CN2022/134317, mailed on Jan. 17, 2023.
(Continued)

*Primary Examiner* — Kenneth A Bratland, Jr.
(74) *Attorney, Agent, or Firm* — PV IP PC; Wei Te Chung

(57) ABSTRACT

An anti-cracking suction device for Czochralski single crystal is provided, wherein the device includes an outer cylinder, an inner cylinder disposed in the outer cylinder, a suction tube, and a first gap. An upper portion of the suction tube extends into the inner cylinder from a bottom of the outer cylinder, a lower portion of the suction tube is disposed outside the outer cylinder. The first gap is disposed between a bottom of the inner cylinder and the outer cylinder, and is configured to cushion a thermal expansion of the bottom of the inner cylinder to reduce stress at where the suction tube is connected with the inner cylinder, in a case that silicon liquid is sucked into the inner cylinder by the suction tube and accumulated at the bottom of the inner cylinder.

20 Claims, 6 Drawing Sheets

(58) Field of Classification Search
USPC ....... 117/11, 13, 19, 21, 200, 206, 208, 214, 117/912, 928, 931–932
See application file for complete search history.

(56) References Cited

U.S. PATENT DOCUMENTS

| | | | |
|---|---|---|---|
| 2002/0088390 A1* | 7/2002 | Thebault | C30B 15/10 117/200 |
| 2011/0048315 A1* | 3/2011 | Kemmochi | C30B 15/10 117/217 |

FOREIGN PATENT DOCUMENTS

| | | |
|---|---|---|
| CN | 215828916 U | 2/2022 |
| CN | 217600897 U | 10/2022 |
| JP | 2018070426 A | 5/2018 |

OTHER PUBLICATIONS

Written Opinion of the International Search Authority in International application No. PCT/CN2022/134317, mailed on Jan. 17, 2023.

* cited by examiner

ANTI-CRACKING SUCTION DEVICE COMPRISING OUTER CYLINDER, INNER CYLINDER, SUCTION TUBE, AND FIRST GAP BETWEEN INNER AND OUTER CYLINDERS

CROSS-REFERENCE TO RELATED APPLICATION

This application is a National Stage of International Application No. PCT/CN2022/134317, filed Nov. 25, 2022, which claims priority to Chinese Patent Application No. 202210196125.0, filed Mar. 1, 2022, titled "Anti-cracking suction device for Czochralski single crystal", both of which are incorporated herein by reference in their entireties.

TECHNICAL FIELD

The present disclosure relates to an auxiliary device for sucking silicon for Czochralski single crystal, and more particularly, to an anti-cracking suction device for Czochralski single crystal.

BACKGROUND

The conventional Czochralski single crystal is drawn by taking section out and re-feeding for times to reduce cost of maintaining a furnace and increase unit yield. However, repeated taking section out and re-feeding may lead to an accumulation of impurities such as metals in the crucible, which greatly reduces lifetime of carriers of a single crystal, and affects quality and effective yield of the single crystal. Moreover, when lifetime abnormality occurs in the carriers of the single crystal, the furnace needs to be stopped directly for inspection, and thereby increasing the cost and reducing the profit. In order to reduce the impurities in residue materials to be accumulated in the crucible, a suction device with an adsorption structure is generally used to suck the residue materials and to re-feed the silicon material.

SUMMARY

An anti-cracking suction device for Czochralski single crystal is provided in the present disclosure, which solves the technical problems that an inner cylinder in a conventional suction device cracks due to an expansion caused by cooling and dissipating heat from a silicon liquid, and causes a suction tube to fall into a quartz crucible or a flow out of the silicon liquid.

To solve at least one of the above technical problems, the embodiments are provided according to the present disclosure.

An anti-cracking suction device for Czochralski crystal includes an outer cylinder; an inner cylinder disposed in the outer cylinder; a suction tube; and a first gap provided between a bottom of the inner cylinder and the outer cylinder; wherein an upper portion of the suction tube extends into the inner cylinder from a bottom of the outer cylinder, and a lower portion of the suction tube is disposed outside the outer cylinder; the first gap is configured to cushion a thermal expansion of the bottom of the inner cylinder to reduce a stress at where the suction tube is connected with the inner cylinder, in a case that silicon liquid is sucked into the inner cylinder by the suction tube and accumulated at the bottom of the inner cylinder.

In an embodiment, the anti-cracking suction device further includes a second gap provided between a side surface of the inner cylinder and the outer cylinder, wherein the first gap communicates with the second gap, and a thickness of the first gap is greater than a thickness of the second gap.

In an embodiment, the anti-cracking suction device includes a tray disposed in the first gap, and a bottom outer edge of the tray is disposed against an arcuate portion of the bottom of the outer cylinder, and a top outer edge of the tray is disposed not in contact with an arcuate portion of the bottom of the inner cylinder.

In an embodiment, a through-hole is provided at a central of the tray, and the through-hole is extended through by the suction tube; wherein a diameter of the through-hole is greater than a diameter of the suction tube and greater than a diameter of a sleeve hole, and the suction tube is extended through the sleeve hole of the outer cylinder.

In an embodiment, the diameter of the through-hole is less than or equal to half of a diameter of the bottom of the inner cylinder.

In an embodiment, a cylinder ring is disposed on an outer wall of the suction tube, and the cylinder ring is disposed in the through-hole.

In an embodiment, a distance from the cylinder ring to the bottom of the inner cylinder is less than half of a height of the through-hole.

In an embodiment, a thickness of the cylinder ring is less than the height of the through-hole, and an outer diameter of the cylinder ring is less than the diameter of the through-hole.

In an embodiment, a plurality of grooves are provided on an upper end face or a lower end face of the tray, each of the plurality of grooves has a depth less than a thickness of the tray.

In an embodiment, the tray includes an inner plate and an outer plate externally connected to the inner plate, wherein the through-hole is provided in the inner plate, a bottom outer edge of the outer plate is disposed against the arcuate portion of the bottom of the outer cylinder, and a top outer edge of the outer plate is disposed not in contact with the arcuate portion of the bottom of the inner cylinder.

In an embodiment, an area of the inner plate is greater than or equal to an area of a planar portion of the bottom of the inner cylinder, and the outer plate is a multi-lobe structure including a plurality of sub-plates.

In an embodiment, the outer cylinder is a separated structure including a plurality of cylinder portions, and splice lines of the plurality of sub-plates are staggered from splice lines of the plurality of cylinder portions.

In an embodiment, the bottom of the inner cylinder is a convex surface.

In an embodiment, a top of the tray is convex to correspond to the bottom of the inner cylinder.

In an embodiment, a top of the inner plate is convex to correspond to the bottom of the inner cylinder.

According to the anti-cracking suction device for Czochralski single crystal according to the present disclosure, a first gap is provided between an inner cylinder and an outer cylinder as a buffer band to relieve an expansion of the inner cylinder due to heating so as to reduce stress at where the suction tube is connected with the inner cylinder. At the same time, the first gap may provide a space for heat dissipation of the silicon liquid at the bottom of the inner cylinder so as to reduce a stress concentrated at the bottom of the inner cylinder near the suction tube, thereby preventing the bottom from being cracked due to the pressure in the inner cylinder. As such, a structure integrity of the bottom of the inner cylinder, especially in a vicinity of the suction tube, is improved, and the silicon liquid is prevented from outflowing.

Figure 1:
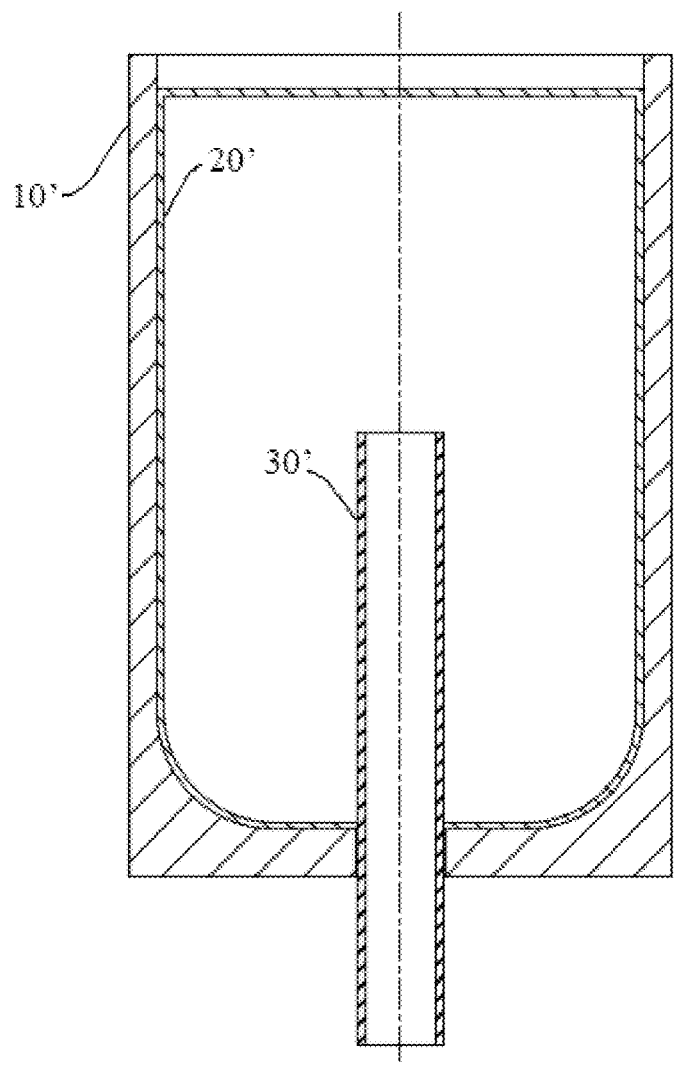
FIG. 1 is a suction device in the prior art.

| Reference numerals: | | |
|---|---|---|
| 10'.conventional outer cylinder | 20'.conventional inner cylinder | 30'.conventional suction tube |
| 10. outer cylinder | 20. inner cylinder | 30. suction tube |
| 40. first gap | 41. second gap | 21.bottom of inner cylinder |
| 22. side surface of inner cylinder | 211. planar portion of the bottom of the inner cylinder | 212. arcuate portion of the bottom of inner cylinder |
| 11. bottom of outer cylinder | 111. planar portion of the bottom of the outer cylinder | 112. arcuate portion of the bottom of the outer cylinder |
| 50. tray | 501. bottom outer edge of tray | 502. top outer edge of tray |
| 51. through-hole | 12. sleeve hole | 60. cylinder ring |
| 52. groove | 53. inner plate | 54. outer plate |
| 541. sub-plate | 542. splice lines | |

DETAILED DESCRIPTION OF THE EMBODIMENTS

The present disclosure is described in detail below with reference to the drawings and embodiments.

Currently, a conventional suction device is an assembled structure including an inner cylinder and an outer cylinder. As shown in FIG. 1, the inner cylinder 20' is generally made of pure quartz and ceramic material, and the outer cylinder 10' is used as a protective sleeve. A suction tube 30' extends through bottoms of the inner cylinder 20' and the outer cylinder 10'. An upper portion of the suction tube 30' is positioned in the inner cylinder 20', and a lower portion of the suction tube 30' is positioned outside the outer cylinder 10'. The suction tube 30' sucks the silicon liquid from the quartz crucible through the lower portion, and drains the sucked silicon liquid into the inner cylinder 20' through the upper portion. As such, the silicon liquid is sucked by the suction tube 30'. Since the silicon liquid dissipates heat during cooling, the inner cylinder 20' is easily expanded due to the heat, thereby causing cracks in the inner cylinder 20' near the suction tube 30'. Further, since the inner cylinder 20' has the cracks, the inner cylinder 20' is easily fragmented due to the pressure of the air inside the inner cylinder 20'. As such, the silicon liquid in the inner cylinder 20' is flowed out, and the suction tube 30' is even disconnected from the inner cylinder 20', thereby leading to a risk of the suction tube 30' falling into the quartz crucible. The quartz crucible is in a softened state with a high temperature, and the bottom of the quartz crucible is easily damaged by the suction tube 30' fallen into the quartz crucible, so that the furnace has to be stopped for inspection.

Figure 2:
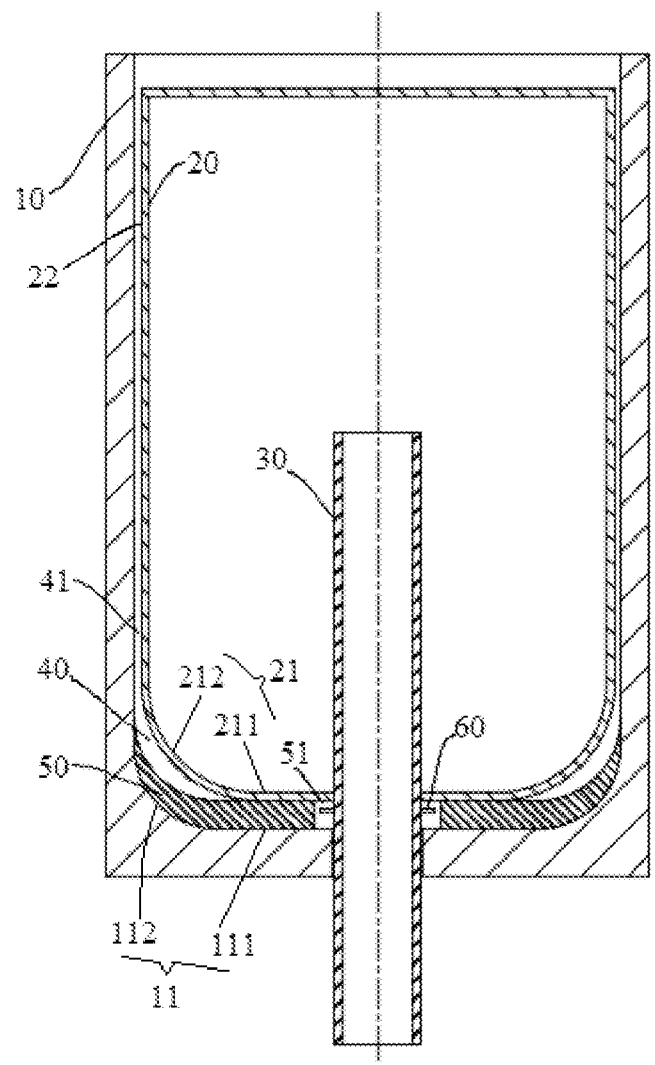
FIG. 2 is a schematic structural diagram of an anti-cracking suction device for Czochralski single crystal according to an embodiment of the present disclosure.
Figure 3:
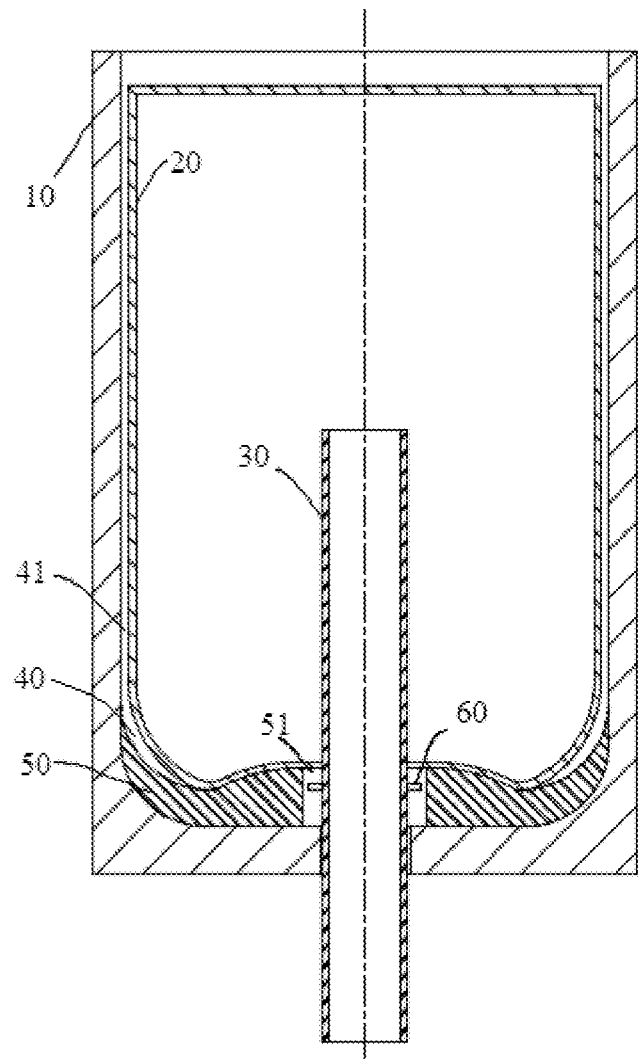
FIG. 3 is a schematic structural diagram of an anti-cracking suction device for Czochralski single crystal according to another embodiment of the present disclosure.

As shown in FIGS. 2-3, an anti-cracking suction device for Czochralski single crystal is provided according to the embodiment. The anti-cracking suction device includes an outer cylinder 10, an inner cylinder 20 disposed in the outer cylinder 10, a suction tube 30, and a first gap 40. An upper portion of the suction tube 30 extends into the inner cylinder 20 from a bottom of the outer cylinder 10, and a lower portion of the suction tube 30 is positioned outside the outer cylinder 10. Thus, the suction tube 30 sucks the silicon liquid in the quartz crucible (under the anti-cracking suction device, not shown) through the lower portion, and drains the sucked silicon liquid into the inner cylinder 20 through the upper portion. Further, the first gap 40 is provided between the bottom 21 of the inner cylinder 20 and the outer cylinder 10. When the silicon liquid is sucked into the inner cylinder 20 by the suction tube 30 and accumulated at the bottom 21 of the inner cylinder 20, the first gap 40 can act as a buffer band to relieve a thermal expansion of the bottom 21. Meanwhile, by relieving the thermal expansion of the bottom 21, the pressure of the inner cylinder 20 against the suction tube 30 is reduced, and the stress at where the suction tube 30 is connected with the inner cylinder 20 is reduced.

Further, as shown in FIGS. 2-3, the anti-cracking suction device further includes a second gap 41 provided between a side surface 22 of the inner cylinder 20 and the outer cylinder 10, and the second gap 41 communicates with the first gap 40. The inner cylinder 20 is expanded by absorbing the heat during cooling of the silicon liquid. The second gap 41 may serve as a buffer band to relieve the expansion and the deformation of the side face 22 of the inner cylinder 20, and to prevent the side surface 22 of the inner cylinder 20 from impinging on a side surface of the outer cylinder 10. Further, a thickness of the first gap 40 is greater than a thickness of the second gap 41. It should be understood that "thickness" refers to a distance spaced between the inner cylinder 20 and the outer cylinder 10, for example, the thickness of the first gap 40 refers to a distance between the bottom 21 and an inner surface of a bottom of the outer cylinder 10, and the thickness of the first gap 40 refers to a distance between the side surface 22 and an inner side surface of the outer cylinder 10. Since the silicon liquid is first accumulated and spread at the bottom 21 of the inner cylinder 20 after being sucked into the inner cylinder 20, the expansion of the bottom 21 of the inner cylinder is also greater than that of the side surface 22 during a subsequent cooling of the silicon liquid. Thus, it allows the first gap 40 with a greater thickness than the second gap 41 to absorb and alleviate a greater expansion at the bottom 21 of the inner cylinder 20.

In this embodiment, the bottom 21 of the inner cylinder 20 may be a flat surface, as such the first gap 40 may be a flat shape, as shown in FIG. 2. The bottom 21 of the inner cylinder 20 may include a planar portion 211 and an arcuate portion 212. Similarly, the bottom 11 of the outer cylinder 10 also includes a planar portion 111 and an arcuate portion 112. A diameter of the arcuate portion 212 of the bottom portion 21 of the inner cylinder 20 is greater than a diameter of the arcuate portion 112 of the bottom portion 11 of the outer cylinder 10, so that the thickness of the first gap 40 is greater than the thickness of the second gap 41.

Alternatively, the bottom portion 21 of the inner cylinder 20 may be a convex surface, for example, may be a convex curved surface, as such the first gap 40 may be a convex shape, as shown in FIG. 3. This is, a cross section of the first gap 40 has a curved structure with a higher height close to the suction tube 30 and a lower height away from the suction tube 30. Thus, the first gap 40 provides a larger buffer space for the bottom portion 21 of the inner cylinder 20 to relieve the deformation caused by thermal expansion of the bottom portion 21. The first gap 40 also further increases the heat dissipation from the bottom 21 of the inner cylinder 20, thereby reducing the stress concentrated on the bottom 21.

Figure 4:
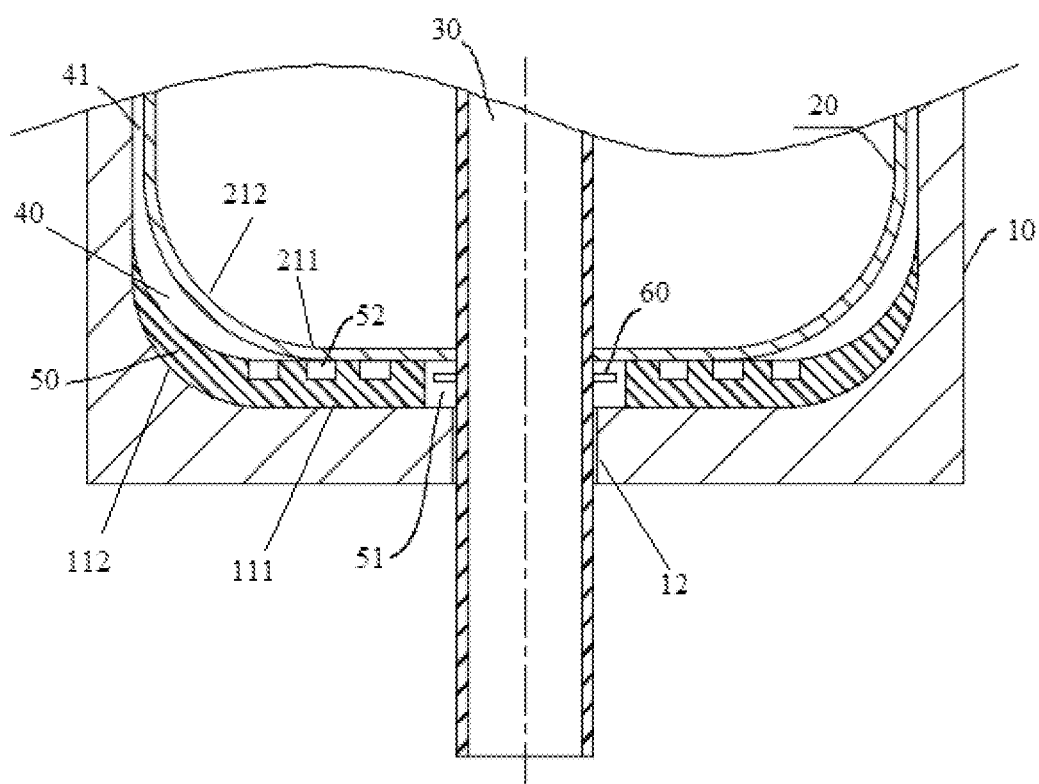
FIG. 4 is a schematic partially enlarged diagram of an anti-cracking suction device for Czochralski single crystal according to an embodiment of the present disclosure.

Further, as shown in FIG. 4, to further separate the inner cylinder 20 from the outer cylinder 10 and to prevent the breakage thereof, a tray 50 is provided in the first gap 40. A shape of the tray 50 corresponds to a shape of the bottom 21 of the inner cylinder 20. It should be understood that, as shown in FIG. 3, when the first gap 40 is a convex shape, a top portion of the tray 50 is also convex to correspond to the bottom portion 21 of the inner cylinder 20.

In addition, an orthographic projection of the tray 50 on a virtual plane perpendicular to a vertical direction covers an orthographic projection of the bottom portion 21 of the inner cylinder 20 on the virtual plane. Also, a bottom outer edge 501 of the tray 50 is provided against the arcuate portion 112 of the bottom 11 of the outer cylinder 10, while a top outer edge 502 of the tray 50 is not in contact with the arcuate portion 212 of the bottom 21 of the inner cylinder 20. Thus, after the silicon liquid is sucked, a sufficient space is left between the arcuate portion 212 of the inner cylinder 20 and the arcuate portion 112 of the outer cylinder 10 to cushion the expansion and the deformation at the arcuate portion 212 of the inner cylinder 20 so as to prevent the inner cylinder 20 from cracking or pulling the outer cylinder 10 made of graphite apart.

In addition, after the silicon liquid is sucked, the silicon liquid stored in the inner cylinder 20 releases heat during cooling, thereby generating a thermal stress on a portion of the suction tube 30 disposed in the inner cylinder 20. The thermal stress is transferred from the portion of the suction tube 30 disposed in the inner cylinder 20 to a portion of the suction tube 30 disposed outside the inner cylinder 20. A difference in the thermal stress is generated along the suction tube 30 due to heat loss during the transfer. As such, the suction tube 30 is easily cracked at where the suction tube 30 is connected with the inner cylinder 20, the suction tube 30 may be disconnected from the bottom of the inner cylinder 20, and in a serious case, the bottom 21 of the inner cylinder 20 may be fragmented. In this embodiment, the tray 50 is arranged to effectively separate the portion of the suction tube 30 disposed in the inner cylinder 20 from the portion of the suction tube 30 disposed outside the inner cylinder 20, thereby reducing thermal stress transferred along the suction tube 30 and avoiding cracking at where the suction tube 30 is connected with the inner cylinder 20. Moreover, even when cracking occurs, the tray 50 prevents the flakes of the bottom portion 21 of the inner cylinder 20 or silicon liquid from falling into the outer cylinder 10 or the quartz crucible.

Further, as shown in FIG. 4, a through-hole 51 is provided at a center of the tray 50, and the suction tube 30 is extended through the through-hole 51. A diameter of the through-hole 51 is greater than a diameter of the suction tube 30 and is greater than a diameter of a sleeve hole 12, wherein the suction tube 30 is extended through the outer cylinder 10 via the sleeve hole 12. The through-hole 51 is defined to provide a space for heat dissipation at where the suction tube 30 is connected to the inner cylinder 20. As such, the concentration of thermal stress here can be further reduced and the thermal stress is released in time. Furthermore, a risk of cracking at where the inner cylinder 20 is connected with the suction tube 30 can be alleviated.

Further, the through-hole 51 with a too large diameter may reduce the overall strength of the tray 50, thereby affecting the tray 50 to support the bottom 21 of the inner cylinder 20, and affecting the inner cylinder 20 to be stably placed on the tray 50. Therefore, the diameter of the through-hole 51 may be less than or equal to half of the diameter of the bottom portion 21 of the inner cylinder 20. In this way, not only a space for heat dissipation is sufficiently provided, but also the overall strength of the tray 50 is ensured.

Further, a cylinder ring 60 is provided on an outer wall of the suction tube 30, and the cylinder ring 60 is disposed in the through-hole 51. That is, the cylinder ring 60 is provided on an outer wall of the suction tube 30 located in the through-hole 51. The cylinder ring 60, the inner cylinder 20, and the suction tube 30 are all made of high-purity ceramic or high-purity quartz, and the cylinder ring 60 is welded to the suction tube 30 by quartz or ceramic. A thickness of the cylinder ring 60 is less than a height of the through-hole 51, and an outer diameter of the cylinder ring 60 is less than a diameter of the through-hole 51. The cylinder ring 60 is provided to prevent the suction tube 30 from falling into the quartz crucible, in the case that the connection position between the suction tube 30 and the inner cylinder 20 is cracked, thereby preventing the quartz crucible from being damaged.

Further, a distance from the cylinder ring 60 to the bottom 21 of the inner cylinder 20 is less than half of the height of the through-hole 51.

In the embodiment, the tray 50 is engaged with the cylinder ring 60 to solve a problem that the connection position between the suction tube 30 and the inner cylinder 20 is easily cracked. Meanwhile, the bottom portion 21 of the inner cylinder 20 is supported by the tray 50, thereby reducing the load bearing on the welding portion between the inner cylinder 20 and the suction tube 30, preventing the silicon liquid and the inner cylinder 20 from directly pressing the suction tube 30, and further protecting the overall structure of the inner cylinder 20. Further, even when the suction tube 30 is fragmented due to the pressure, the cylinder ring 60 can prevent the suction tube 30 from falling into the quartz crucible.

Before the silicon liquid is sucked, the portion of the suction tube 30 in the inner cylinder 20 is effectively separated from the portion of the suction tube 30 outside the inner cylinder 20 by the tray 50, so as to prevent the connection position between the inner cylinder 20 and the suction tube 30 from cracking due to a downward force exerted on the suction tube 30 by a gravity of the cylinder ring 60. Further, the inner cylinder 20, the suction tube 30, or the cylinder ring 60 made of high-purity ceramic or high-purity quartz are softened due to thermal stress in a heated condition. The tray 50 provides a support to further reduce the stress at where the suction tube 30 is welded to the inner cylinder 20 and the cylinder ring 60.

Figure 5:
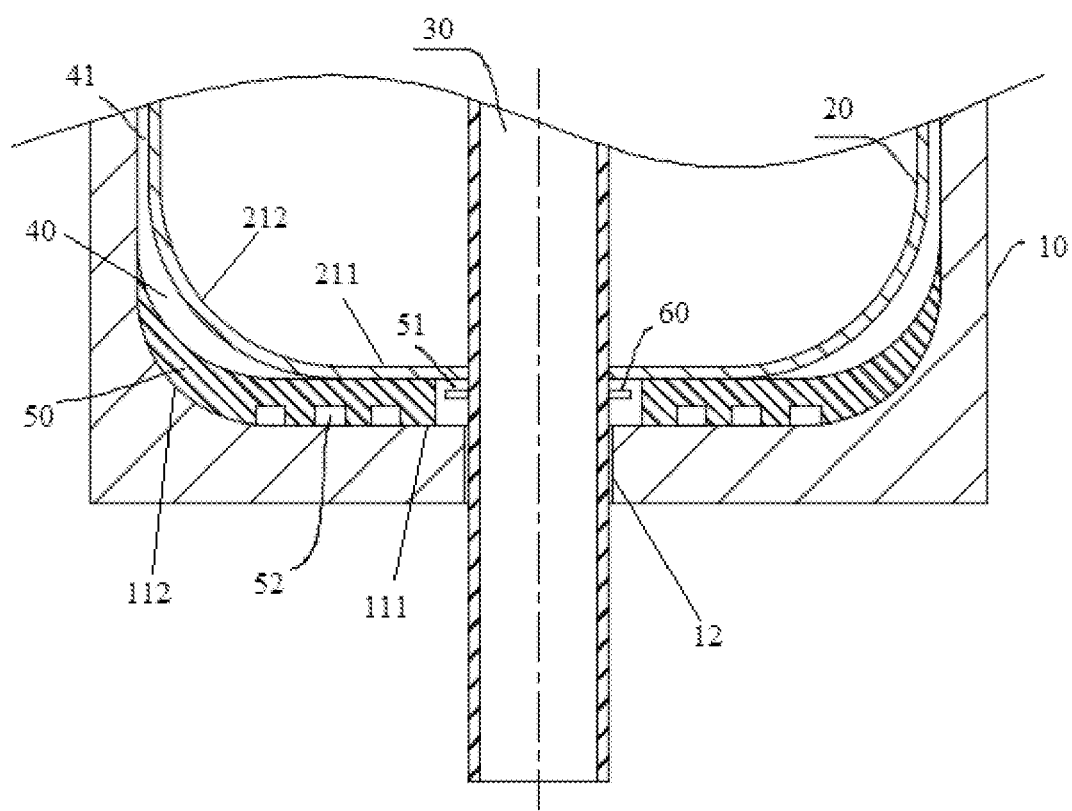
FIG. 5 is a schematic partially enlarged diagram of an anti-cracking suction device for Czochralski single crystal according to an embodiment of the present disclosure.

Further, as shown in FIGS. 2-3, the tray 50 may be a unitary structure. As shown in FIGS. 4-5, a plurality of grooves 52 are provided on an upper end face or a lower end face of the tray 50, and a depth of each of the plurality of grooves 52 is less than a thickness of the tray 50. The plurality of grooves 52 may be spaced along the upper or lower end face of the tray 50. In this way, not only the overall strength of the tray 50 can be reduced, but also the stable support to the inner cylinder 20 can be ensured, so as to avoid the risk of the inner cylinder 20 cracking or pulling the outer cylinder 10 apart. Meanwhile, the usage cost of the suction device is reduced, the nominal service life of the suction device is prolonged, and the overall cost is reduced.

Figure 6:
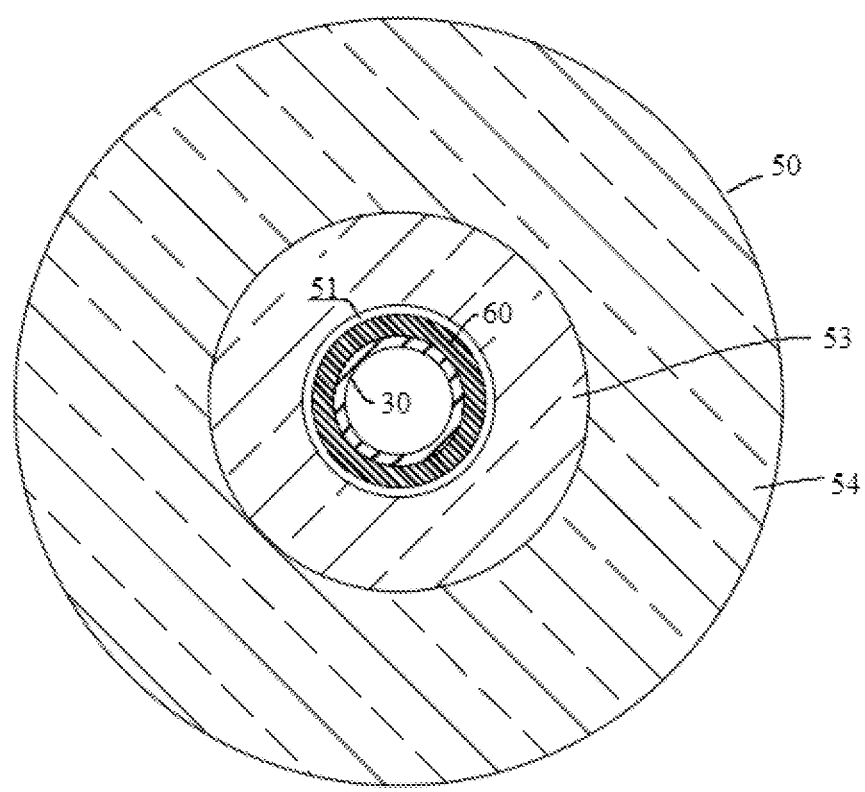
FIG. 6 is a schematic structural diagram of a tray according to an embodiment of the present disclosure.
Figure 7:
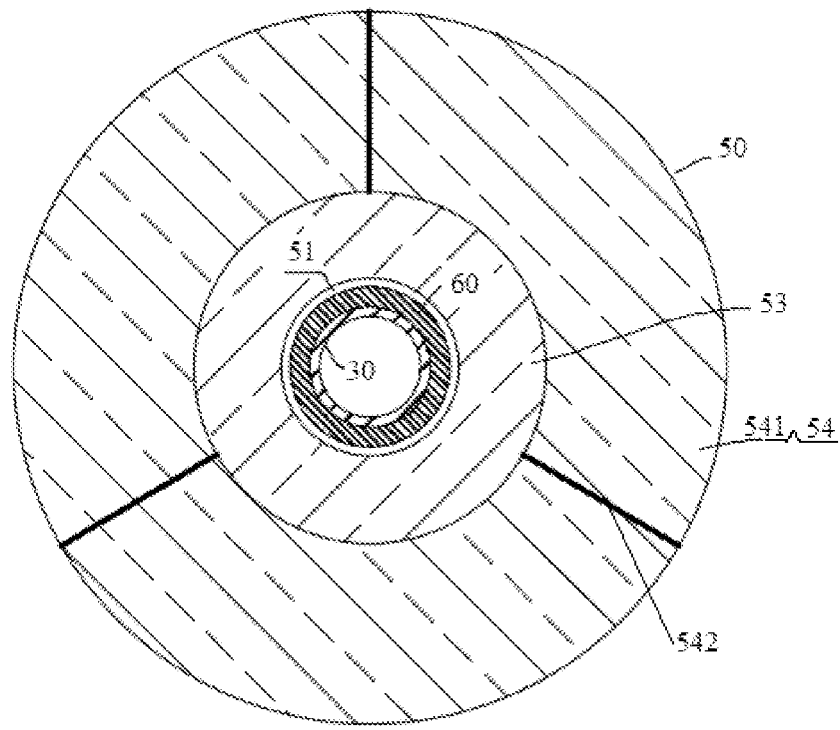
FIG. 7 is a schematic structural diagram of a tray according to another embodiment of the present disclosure.

Further, as shown in FIGS. 6-7, the tray 50 may be a separated structure including an inner plate 53 and an outer plate 54, wherein the inner plate 53 has a through-hole 51, the outer plate 54 is externally connected to the inner plate 53, and the inner plate 53 is a unitary structure. Also, an area of the inner plate 53 is greater than or equal to an area of the planar portion 211 of the bottom portion 21 of the inner cylinder 20. The outer plate 54 may be a multi-lobe structure including a plurality of sub-plates 541, as shown in FIG. 7. For example, the outer plate 54 may be a two-lobe structure including two sub-plates 541 (not shown) or a lobe structure including three sub-plates 541 (as shown in FIG. 7). In a case that the outer cylinder 10 is a unitary structure, the splice lines among the plurality of sub-plates 541 may be arranged as desire. In a case that the outer cylinder 10 is a separated structure including a plurality of cylinder portions, the splice lines 542 among the plurality of sub-plates 541 are staggered from the splice lines of the plurality of cylinder portions. Alternatively, the outer plate 54 may be a unitary structure, as shown in FIG. 6, so long as the inner plate 53 and the outer plate 54 are integrally spliced, and the area of the inner plate 53 is at least equal to the area of the planar portion 211 of the bottom portion 21 of the inner cylinder 20.

It should be understood that in a case that the tray 50 may be in a separated structure, a bottom outer edge of the outer plate 54 is attached closely to the arcuate portion 112 of the bottom portion 11 of the outer cylinder 10, while a top outer edge of the outer plate 54 is not in contact with the arcuate portion 212 of the bottom portion 21 of the inner cylinder 20. Further, in a case that the bottom 21 of the inner cylinder 20 is a convex surface, as shown in FIG. 3, a top portion of the inner plate 54 is convex to correspond to the bottom portion 21 of the inner cylinder 20.

In the embodiment, the first gap 40 and the second gap 41 serve as buffer bands between the inner cylinder 20 and the outer cylinder 10, so that expansion of the inner cylinder 20 can be relieved. The tray 50 may be adapted to the inner cylinder 20 with different structures, to provide a buffer space for the expansion of the cooled silicon liquid, so that the tray 50 provides applicability for furnaces with different types and thermal fields with different sizes. Moreover, the tray 50 is made of isostatic graphite material, not only to avoid the potential risk of expansion and cracking of the inner cylinder 20 due to unbearable heat dissipation during cooling of the silicon liquid, but also to maintain the outer cylinder 10 as a whole. The tray 50 provides a support function to effectively reduce the load bearing at the welding position between the suction tube 30 and the inner cylinder 20, and at the welding position between the suction tube 30 and the cylinder ring 60, so that the outer cylinder 10 made of the graphite material is not easily fragmented, the nominal service life of the suction device is prolonged, and the overall cost is reduced. The cylinder ring 60 avoids the quartz crucible from damaging caused by the fragmented suction tube 30 falling into the quartz crucible, and prevents effects on the formation and quality of the single crystal drawn after re-feeding.

According to the anti-cracking suction device for Czochralski single crystal in the present disclosure, a first gap and a second gap are provided between an inner cylinder and an outer cylinder as buffer bands to relieve expansion of the inner cylinder due to heating so as to reduce stress at where the suction tube and the inner cylinder are connected. At the same time, the first gap may provide a space for the heat dissipation of the silicon liquid at the bottom of the inner cylinder so as to reduce the stress concentration at the bottom of the inner cylinder near the suction tube, thereby preventing the bottom from being cracked due to the pressure in the inner cylinder. As such, the structure integrity of the bottom of the inner cylinder, especially in the vicinity of the suction tube, is improved, and the silicon liquid is prevented from outflowing.

At the same time, a tray may be placed in the first gap and a cylinder ring may be fixed to a portion of the suction tube in the through-hole of the tray, to further separate the inner tube from the outer tube, thereby effectively reducing the load bearing at where the suction tube is connected with the inner tube and the cylinder ring. At the same time, the risk that the inner cylinder is expanded by heat to pull the outer cylinder apart is avoided, the suction tube is prevented from being fragmented at the connection position between the suction tube and the inner cylinder and falling into the quartz crucible, and the quartz crucible is prevented from being damaged.

It should be noted that, in the present disclosure, the term "take section out" denotes a procedure for taking out the monocrystalline silicon rod being drawn or drawn from a drawing apparatus for the monocrystalline silicon rod, the term "re-feeding" denotes a procedure for re-feeding the raw material used to form the monocrystalline silicon rod into the drawing apparatus during the operation, and the term "suction" denotes a procedure for sucking the material remained in crucible.

The embodiments of the present disclosure have been described in detail above and are merely applications of the present disclosure and are not to be considered as limiting the scope of the present disclosure. All equivalents and modifications made in accordance with the scope of the present disclosure should be understood within the scope of the present disclosure.

What is claimed is:

1. An anti-cracking suction device for single crystal growth by a Czochralski method, comprising:
   an outer cylinder;
   an inner cylinder disposed in the outer cylinder;
   a suction tube; wherein an upper portion of the suction tube extends into the inner cylinder from a bottom of the outer cylinder, and a lower portion of the suction tube is disposed outside the outer cylinder; and
   a first gap provided between a bottom of the inner cylinder and the outer cylinder;
   wherein the first gap is configured to cushion a thermal expansion of the bottom of the inner cylinder to reduce a stress at where the suction tube is connected with the inner cylinder, in a case that silicon liquid is sucked into the inner cylinder by the suction tube and is accumulated at the bottom of the inner cylinder; and
   wherein the anti-cracking suction device further comprises a tray disposed in the first gap, a bottom of the tray is disposed against the bottom of the outer cylinder, the tray comprises an inner plate and an outer plate externally connected to the inner plate, a surface of the inner plate on a side away from the bottom of the outer cylinder is disposed against the bottom of the inner cylinder, a surface of the outer plate on a side away from the bottom of the outer cylinder is spaced apart from the bottom of the inner cylinder, and a thickness of the outer plate gradually increases along a direction toward the suction tube.

2. The anti-cracking suction device of claim 1, further comprising a second gap provided between a side surface of the inner cylinder and the outer cylinder, wherein the first gap communicates with the second gap, and a thickness of the first gap is greater than a thickness of the second gap.

3. The anti-cracking suction device of claim 1, wherein a bottom outer edge of the tray is disposed against an arc-shaped portion of the bottom of the outer cylinder, and a top outer edge of the tray is not in contact with an arc-shaped portion of the bottom of the inner cylinder.

4. The anti-cracking suction device of claim 3, wherein a through-hole is provided at a central of the tray, and the through-hole is extended through by the suction tube; wherein a diameter of the through-hole is greater than a diameter of the suction tube and greater than a diameter of a sleeve hole of the outer cylinder, and the suction tube is extended through the sleeve hole of the outer cylinder.

5. The anti-cracking suction device of claim 4, wherein the diameter of the through-hole is less than or equal to half of a diameter of the bottom of the inner cylinder.

6. The anti-cracking suction device of claim 4, wherein a cylinder ring is disposed on an outer wall of the suction tube, and the cylinder ring is disposed in the through-hole.

7. The anti-cracking suction device of claim 6, wherein a distance from the cylinder ring to the bottom of the inner cylinder is less than half of a height of the through-hole.

8. The anti-cracking suction device of claim 6, wherein a thickness of the cylinder ring is less than a height of the through-hole, and an outer diameter of the cylinder ring is less than the diameter of the through-hole.

9. The anti-cracking suction device of claim 3, wherein a plurality of grooves are provided on an upper end face or a lower end face of the tray, each of the plurality of grooves has a depth less than a thickness of the tray.

10. The anti-cracking suction device of claim 4, wherein the through-hole is provided in the inner plate, a bottom outer edge of the outer plate is disposed against the arc-shaped portion of the bottom of the outer cylinder, and a top outer edge of the outer plate is not in contact with the arc-shaped portion of the bottom of the inner cylinder.

11. The anti-cracking suction device of claim 10, wherein an area of the inner plate is greater than or equal to an area of a planar portion of the bottom of the inner cylinder, and the outer plate is a multi-lobe structure including a plurality of sub-plates.

12. The anti-cracking suction device of claim 11, wherein the outer cylinder is a separated structure including a plurality of cylinder portions, and splice lines of the plurality of sub-plates are staggered from splice lines of the plurality of cylinder portions.

13. The anti-cracking suction device of claim 1, wherein the bottom of the inner cylinder protrudes in a direction away from the bottom of the outer cylinder.

14. The anti-cracking suction device of claim 3, wherein a top of the tray is convex to correspond to the bottom of the inner cylinder.

15. The anti-cracking suction device of claim 10, wherein a top of the inner plate is convex to correspond to the bottom of the inner cylinder.

16. The anti-cracking suction device of claim 2, further comprising a tray disposed in the first gap, and a bottom outer edge of the tray is disposed against an arc-shaped portion of the bottom of the outer cylinder, and a top outer edge of the tray is not in contact with an arc-shaped portion of the bottom of the inner cylinder.

17. The anti-cracking suction device of claim 5, wherein a cylinder ring is disposed on an outer wall of the suction tube, and the cylinder ring is disposed in the through-hole.

18. The anti-cracking suction device of claim 7, wherein a thickness of the cylinder ring is less than the height of the through-hole, and an outer diameter of the cylinder ring is less than the diameter of the through-hole.

19. The anti-cracking suction device of claim 4, wherein a plurality of grooves are provided on an upper end face or a lower end face of the tray, each of the plurality of grooves has a depth less than a thickness of the tray.

20. The anti-cracking suction device of claim 4, wherein the tray comprises an inner plate and an outer plate externally connected to the inner plate, wherein the through-hole is provided in the inner plate, a bottom outer edge of the outer plate is disposed against the arc-shaped portion of the bottom of the outer cylinder, and a top outer edge of the outer plate is not in contact with the arc-shaped portion of the bottom of the inner cylinder.

\* \* \* \* \*